United States Patent
Garcia de Alba Garcin et al.

(10) Patent No.: US 9,065,445 B2
(45) Date of Patent: Jun. 23, 2015

(54) VOLTAGE CLAMP ASSIST CIRCUIT

(71) Applicant: Continental Automotive Systems US, Inc., Auburn Hills, MI (US)

(72) Inventors: Sergio Garcia de Alba Garcin, Guadalajara (MX); Izcoatl Emmanuel Sanchez Gonzalez, Guadalajara (MX); Jose Ortega Sanchez, Zapopan (MX)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/064,646

(22) Filed: Oct. 28, 2013

(65) Prior Publication Data

US 2015/0116007 A1   Apr. 30, 2015

Related U.S. Application Data (60) Provisional application No. 61/737,850, filed on Dec. 17, 2012.

(51) Int. Cl.
| H03K 5/08 | (2006.01) |
| H03K 17/16 | (2006.01) |
| H03K 17/082 | (2006.01) |

(52) U.S. Cl.
CPC .......... *H03K 17/165* (2013.01); *H03K 17/0822* (2013.01)

(58) Field of Classification Search
USPC ................ 327/310, 309, 312, 313, 315–324, 327/327–330, 108–112, 427, 434, 437, 327/379–391, 551; 326/82, 83, 26, 27
See application file for complete search history.

(56) References Cited

U.S. PATENT DOCUMENTS

| | | | | |
|---|---|---|---|---|
| 4,841,166 A * | 6/1989 | Harnden | ........................ | 327/110 |
| 5,012,381 A * | 4/1991 | Elliott et al. | ..................... | 361/84 |
| 5,420,532 A * | 5/1995 | Teggatz et al. | ................ | 327/365 |
| 5,508,906 A * | 4/1996 | Nelli et al. | ........................ | 363/97 |
| 5,763,963 A * | 6/1998 | Zydek et al. | ..................... | 307/130 |
| 5,977,756 A * | 11/1999 | Nagata et al. | ................... | 323/282 |
| 6,348,820 B1 * | 2/2002 | Bennett et al. | ................ | 327/110 |
| 6,369,533 B1 * | 4/2002 | Mourad et al. | ........... | 318/400.21 |
| 6,580,321 B1 | 6/2003 | Arell et al. | | |
| 6,829,152 B2 * | 12/2004 | Miura et al. | ..................... | 363/40 |
| 6,963,183 B1 * | 11/2005 | Kessler et al. | ................ | 318/434 |
| 7,433,171 B2 * | 10/2008 | Vincent et al. | ................ | 361/159 |
| 7,636,005 B2 | 12/2009 | Nadd | | |
| 7,940,503 B2 | 5/2011 | Volke | | |
| 2010/0073067 A1 * | 3/2010 | Honea | ........................... | 327/430 |

OTHER PUBLICATIONS

"RC High Pass Filter", Apr. 9, 2000, http://hyperphysics.phy-astr.gsu.edu/hbase/electric/filcap.html.*
"AC Voltage Divider", May 24, 2000, http://hyperphysics.phy-astr.gsu.edu/hbase/electric/vdivac.html#c1.*
Halstead, J., "Battery undervoltage warning circuit", Nov. 21, 2006, http://www.evconvert.com/article/battery-undervoltage-warning-circuit.*

* cited by examiner

*Primary Examiner* — Lincoln Donovan
*Assistant Examiner* — Thomas Skibinski (57) ABSTRACT

A transistor driven load circuit includes a gate driver transistor includes an internal voltage clamp, a controller providing a gate control signal operable to control a state of said gate driver, a load connected to said gate driver, such that said gate driver allows power to flow through the load when the gate driver is in an on state and prevents power from flowing through the load when the gate driver is in an off state, a clamp assist circuit connected in electrical parallel to the load, wherein the clamp assist circuit is operable to dissipate energy flowing through the load during a high energy event in a recirculating device.

8 Claims, 7 Drawing Sheets

VOLTAGE CLAMP ASSIST CIRCUIT

BACKGROUND OF THE INVENTION

The present disclosure relates generally to voltage clamps for control devices such as transistors and, more particularly, to a clamp assist circuit for the same.

Control devices, such as those used in power train high side and low side control circuits, are frequently required to dissipate energy within the control device. In some instances, the level of dissipation required exceeds the energy dissipation ability of an internal voltage clamp of control device, potentially damaging the internal electronics of the control device.

To address the energy dissipation needs, existing control devices utilize a recirculation diode that recirculates current and, in the process, dissipates energy within the recirculation diode. The recirculation diode is arranged in a voltage clamp configuration, and only recirculates current when the clamp voltage is exceeded. Existing recirculation diodes and clamp circuits typically have a relatively low clamp voltage, thereby limiting the maximum voltage that can pass through the control device, and thus be absorbed by the control device, to a low magnitude.

At the same time, in some control devices, a high clamping voltage is required in order to guarantee a fast dissipation of the stored energy. The voltage clamp including a recirculation diode utilized in existing systems lowers the clamping voltage, thereby slowing the rate at which the energy is dissipated.

SUMMARY OF THE INVENTION

Disclosed is a transistor driven load circuit having a gate driver transistor including an internal voltage clamp, a controller providing a gate control signal operable to control a state of said gate driver, a load connected to said gate driver, such that said gate driver allows power to flow through the load when the gate driver is in an on state and prevents power from flowing through the load when the gate driver is in an off state, a clamp assist circuit connected in electrical parallel to the load, wherein the clamp assist circuit is operable to dissipate energy flowing through the load during a high energy event in a recirculating device.

Also disclosed is a method for dissipating energy in a transistor driven load circuit including the steps of: activating a clamp assist circuit when a voltage threshold is exceeded, delaying activation of a recirculating device within the clamp assist circuit when the clamp assist circuit is activated using a delay network such that an internal voltage clamp of a gate driver can activate, dissipating energy within the recirculating device in the clamp assist circuit, thereby preventing an energy dissipation within the internal voltage clamp from exceeding a rated value.

DETAILED DESCRIPTION

Figure 1:
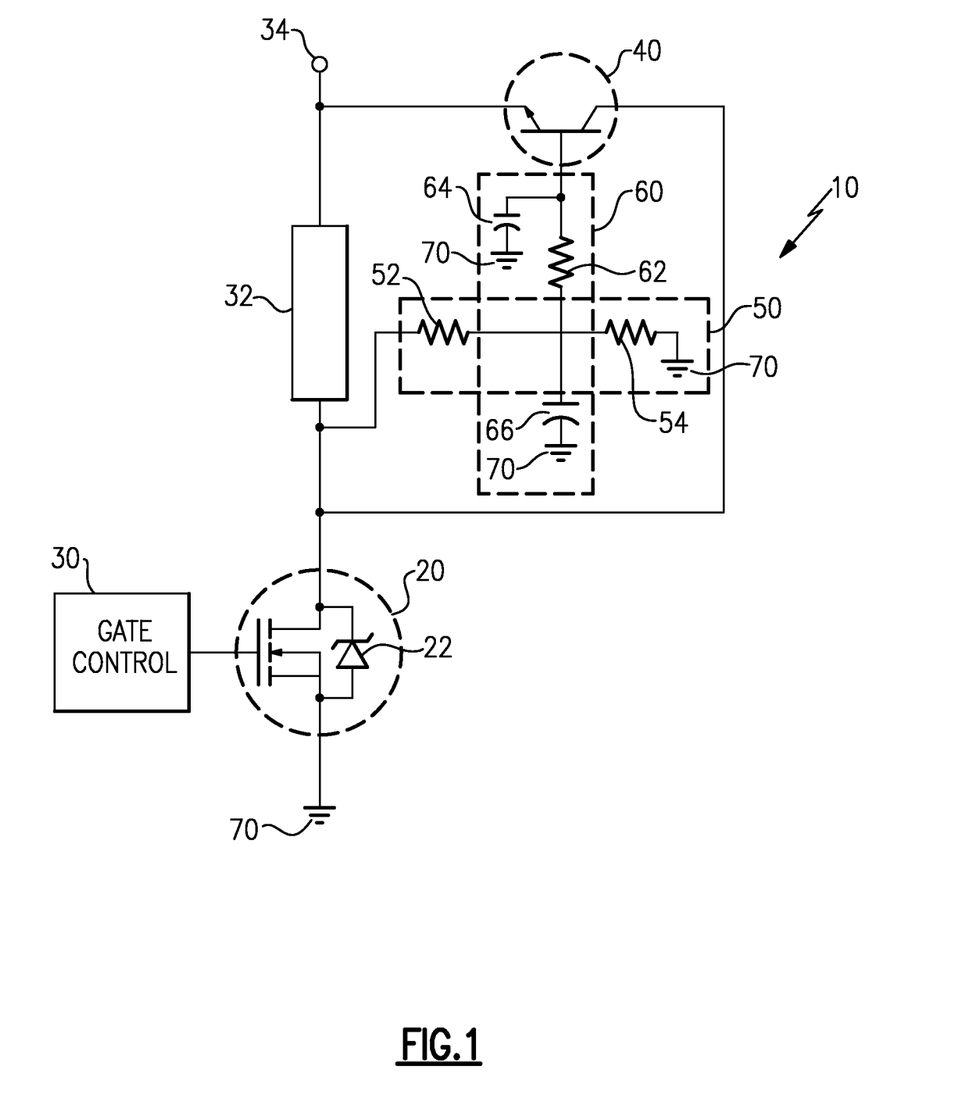
FIG. 1 schematically illustrates a low side driven control device, load, and a clamp assist circuit in conjunction with a low side driven control device and a load.

FIG. 1 illustrates a high voltage clamp assist circuit 10 that aids an internal clamp 22 of a low side driven control device (MOSFET 20) in dissipating energy. The MOSFET 20 is controlled by a gate control circuit 30 using a known gate control scheme. The MOSFET 20 drives a load 32 and controls the flow of power through the load 32 from a voltage source 34. While the load 32 can be any load type, one of skill in the art will appreciate that a majority of loads include at least an inductive and a resistive component and will therefore be an inductive/resistive (IR) load.

The clamp assist circuit 10 is connected to the load 32 and includes three primary components: a recirculation device 40, a voltage divider 50 and a clamp delay network 60. In the illustrated example, the recirculating device 40 is a bipolar junction transistor (BJT). In alternate examples, any suitable recirculating device, such as a transistor of another transistor topology, can be utilized to the same effect. When the recirculation device 40 is on, energy is routed through the recirculation device 40 allowing some of the energy to be dissipated within the recirculation device 40.

A control signal for the recirculation device 40 is provided by the voltage divider 50 and the delay network 60. The voltage divider 50 includes a pair of resistors 52, 54. The first resistor 52 is connected between the MOSFET 20 and the clamp delay network 60, and a second resistor 54 is connected between the clamp delay network 60 and a ground 70. The specific resistances of the resistors 52, 54 define a threshold voltage at which power begins to be provided to the control input of the recirculating device 40 from the node connecting the resistors 52, 54. One of skill in the art, having the benefit of this disclosure, would be able to determine a particular resistance for each resistor 52, 54 required to achieve a desired voltage threshold above which the clamp assist circuit 10 begins to operate. In some examples including multiple parallel clamp assist circuits, the particular voltage thresholds of each clamp assist circuit is not identical across all the clamp assist circuits.

The clamp delay network 60 includes a resistor 62 and two capacitors 64, 66. The first capacitor 64 connects the control input of the recirculation device 40 to ground 70, and the second capacitor 66 connects the resistor 62 and the voltage divider 50 to ground 70. During operation, when the voltage threshold set by the voltage divider 50 is initially exceeded, power flows into the delay network 60. The power in the delay network 60 is prevented from reaching the control input of the recirculation device 40 for a period of time determined at least partially by the capacitance values of the first and second capacitors 64, 66 thereby delaying the activation of the recirculation device 40. This delay in activating the recirculating device 40 provides time for the internal voltage clamp 22 of the MOSFET 20 to act on its own before introducing the clamp assist circuit 10.

Figure 2:
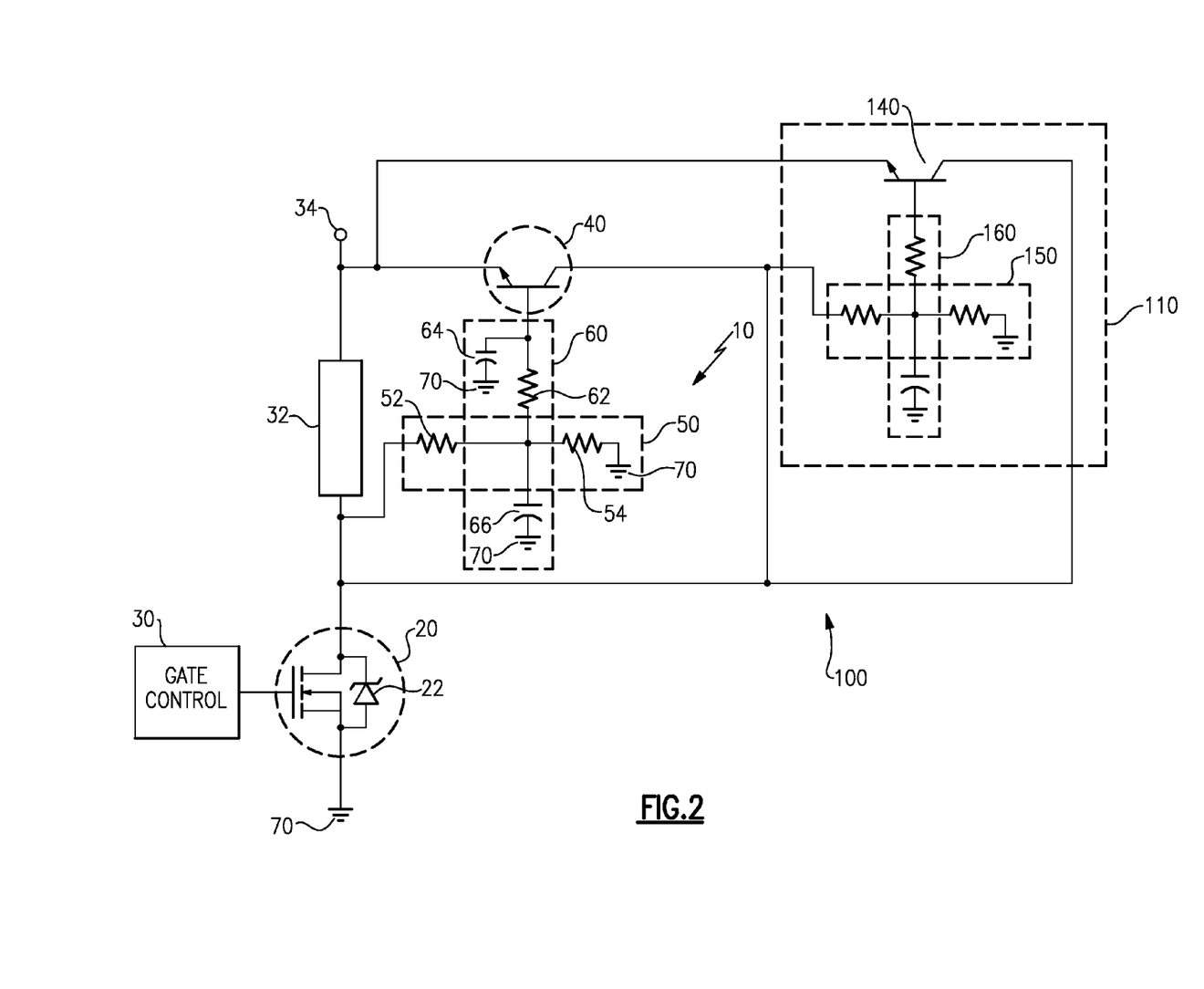
FIG. 2 schematically illustrates an alternate example clamp assist circuit in conjunction with a low side driven control device and a load.

With continued reference to FIG. 1, and with like numerals indicating like elements, FIG. 2 illustrates an alternate example clamp assist circuit 100. The alternate clamp assist circuit 100 illustrated in FIG. 2 includes the same elements described previously and illustrated in FIG. 1. The example in FIG. 2 further incorporates an additional parallel clamp assist circuit 110. The parallel clamp assist circuit 110 is connected to the load 32 in parallel with the primary clamp assist circuit 10. As with the primary clamp assist circuit 10, the parallel clamp assist circuit 110 includes a voltage divider circuit 150 and a delay network 160 arranged similarly to the voltage divider 50 in the delay network 60 described above. The voltage divider circuit 150 and the delay network 160 operate in the same manner as the voltage divider 50 and the delay network 60 described above.

Inclusion of the parallel clamp assist circuit 110 provides redundant clamp assist properties, and further increases the ability of the overall clamp assist configuration to absorb excess energy. Further, one of skill in the art, having the benefit of this disclosure, would appreciate that any number of parallel clamp assist circuits 110 can be utilized in an arrangement similar to the parallel arrangement illustrated in FIG. 2 and further magnify the recognized benefits of the parallel clamp assist circuits.

Figure 3:
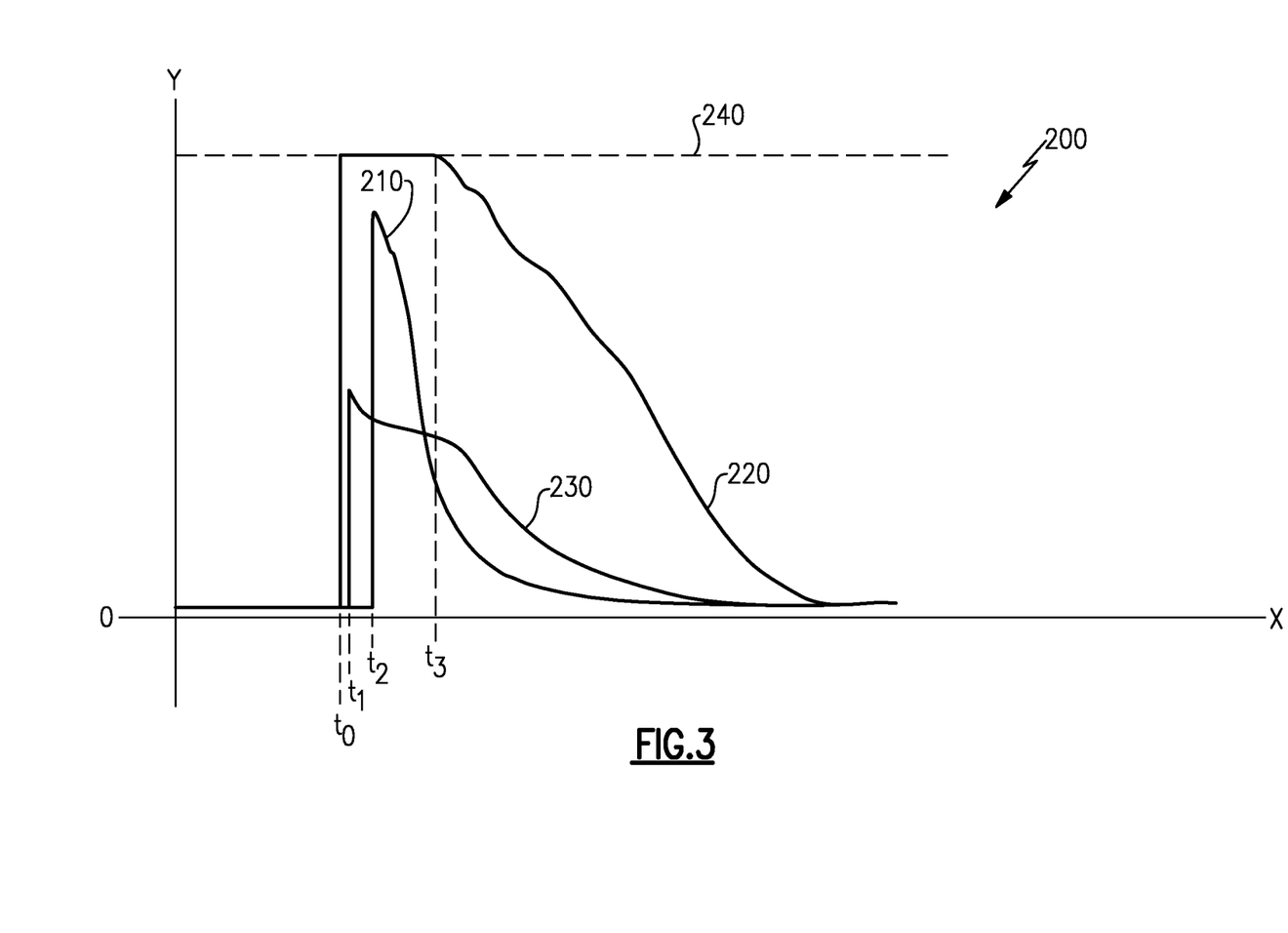
FIG. 3 illustrates a plot of energy dissipation within the circuit of FIG. 2 during a high energy event.

FIG. 3 illustrates an example plot 200 demonstrating the amount of energy dissipated in the MOSFET 20 internal clamp 22 of FIG. 2 with respect to time at line 210, the amount of energy dissipated in the primary clamp assist circuit 10 of FIG. 2 with respect to time at line 220, and the amount of energy dissipated in the secondary clamp assist circuit 110 of FIG. 2 with respect to time at line 230. In the example plot 200, an energy spike (high energy event) occurs at time $t_o$. Once the voltage divider thresholds are exceeded, the delay networks in the clamp assists circuits 10, 100 begin working, allowing time for the internal clamp 22 to activate and work at $t_2$. As can be seen from the plot 200, significant amounts of energy can be dissipated in a relatively short time period with a relatively high voltage clamp level 240 using the clamp assist circuits 10, 100 described above.

Figure 4:
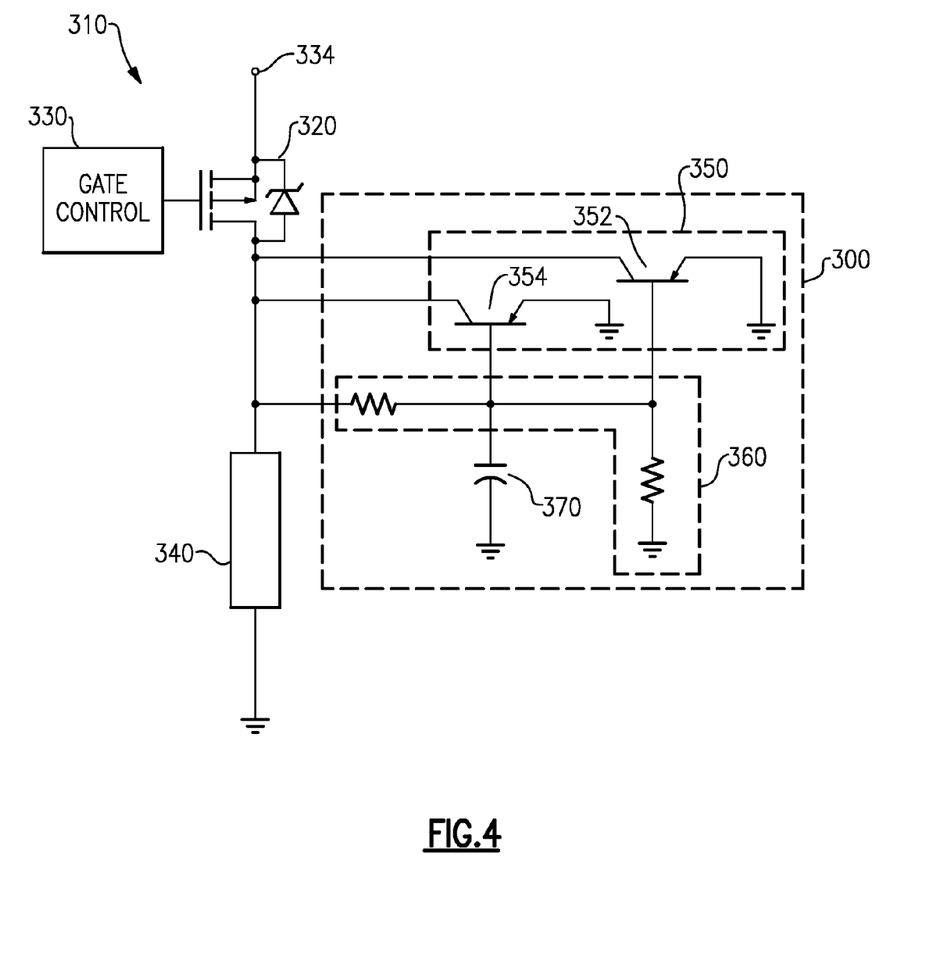
FIG. 4 illustrates a clamp assist circuit in conjunction with a high side driven control device and a load.

FIG. 4 illustrates a clamp assist circuit 300 for use in conjunction with a high side gate driver arrangement 310. As with the circuit of FIG. 1, a gate control circuit 330 controls a mosfet 320 using a known high side control scheme, and the MOSFET 320 drives a load 340. The load 340 is connected to a voltage source 334. The load 340 can be any load, however, it is understood that most loads 340 will be inductive/resistive (IR) loads 340.

The clamp assist circuit 300 includes two recirculating devices 352, 354 arranged as a recirculation circuit 350. Connected to the high side of the load and the recirculation circuit 350 is a voltage divider 360. Similarly, connected to the voltage divider 360 and ground is a delay circuit 370. In the illustrated example of FIG. 4, the delay circuit 370 is a capacitor.

Each of the three components 350, 360, 370 of the clamp assist circuit 300 functions as described above with regard to the low side clamp assist circuits 10, 100 and illustrated in FIGS. 1 and 2. Similarly, as in the example of FIG. 2, additional clamp assist circuits can be connected in parallel to the primary clamp assist circuit 300 and provide the previously described additional benefits of parallel clamp assist circuits.

Figure 5A:
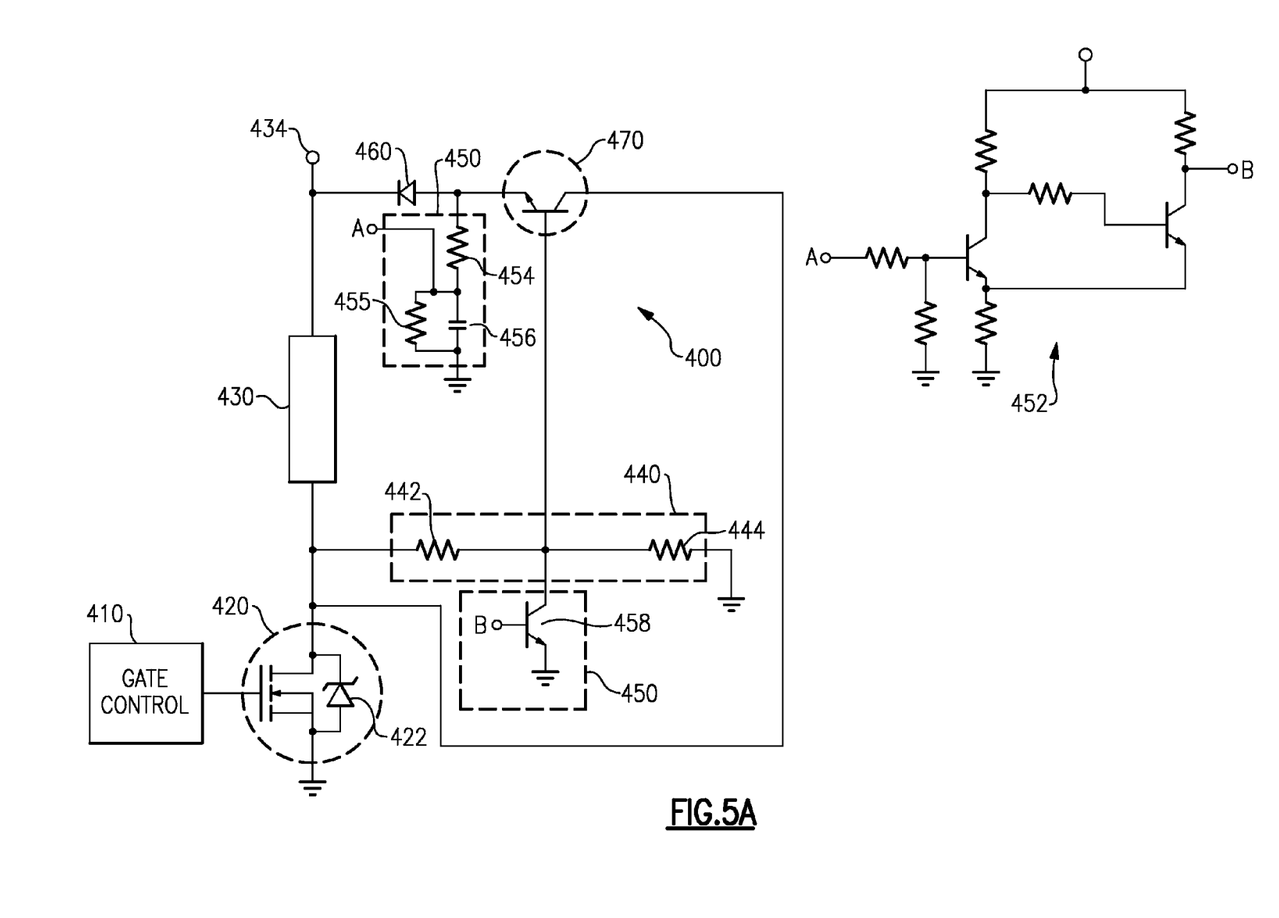
FIG. 5A schematically illustrates a low side driven control device in connection with a load and a parallel pulsed clamp assist circuit.

In some example systems, increasing the magnitude of the energy that can be dissipated by the clamp assist circuit(s) is a higher priority than increasing the speed of the energy dissipation. Each of the previously described clamp assist circuits 10, 100, 300 dissipates energy quickly at the expense of a total magnitude of energy that can be dissipated. FIG. 5 illustrates a pulsed clamping assist circuit 400 that increases the magnitude of energy dissipation.

As with the previous circuits, a gate control 410 controls a drive transistor 420 with an internal clamping circuit 422 (a zener diode). The drive transistor 420 is connected to a low side of a load 430. The load 430 is connected to a voltage 434. The load 430 can be any load type, however, one of skill in the art will appreciate that a typical load is an inductive/resistive (IR) load. The pulsed clamp assist circuit 400 includes a voltage divider 440, an oscillator circuit 450, a diode 460 and a recirculating device 470.

Within the oscillator circuit 450 is a standard Schmidt trigger circuit 452. The Schmidt trigger circuit 452 connects two resistors 454, 455 and a capacitor 456 to a recirculation device 470 gate control switch 458. In particular, the resistances and capacitance of the resistors 454, 455 and capacitor 456 control the rate at which the Schmidt trigger 452 pulses according to known principles. The pulsing of the Schmidt trigger in turn controls the pulsing of the switch 458 and the on/off pulsing of the recirculation device 470. The energy dissipation is alternated between the clamping assist circuit 400 and the drive transistor 420 internal clamping circuit 422.

The voltage divider 440 includes two resistors 442, 444 with the resistance values of the resistors 442, 444 determining a voltage threshold at which the pulse clamp assist circuit 400 begins operating. The diode 460 is placed between the oscillator 450 and the load 430, and prevents the oscillator 450 from being back-charged.

While the circuit configuration of FIG. 5 is that of a low side driver, one of skill in the art having the benefit of this disclosure could adapt the pulsed clamp assist circuit 400 to operate as a high side driver pulsed clamp assist circuit in a similar manner to the clamp assist circuit 300 illustrated in FIG. 4.

Figure 5B:
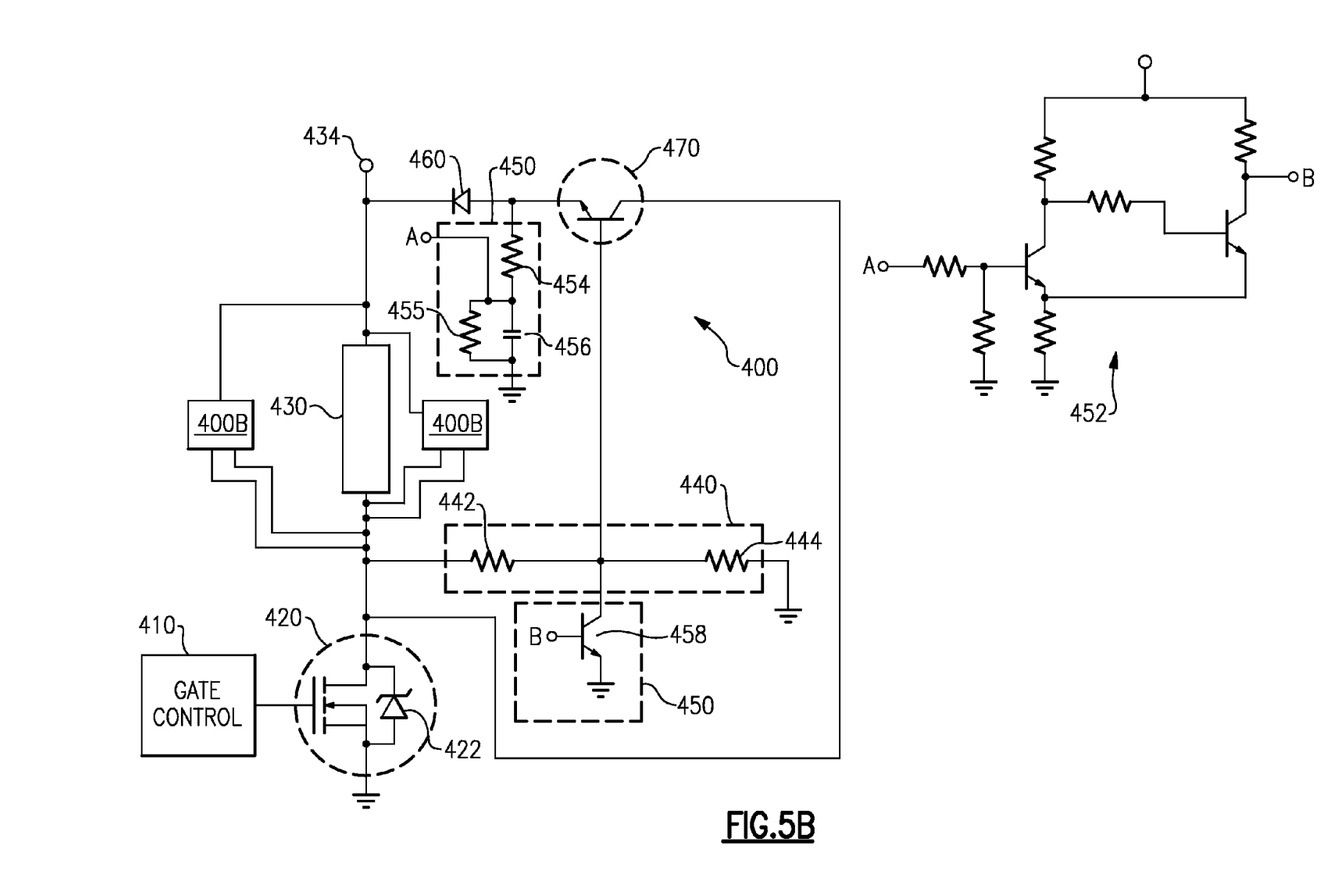
FIG. 5B schematically illustrates a low side driven control device in conjunction with a load and multiple parallel pulsed clamp assist circuits.

Furthermore, as with the previous examples, the pulsed clamp assist circuit 400 of FIG. 5 can include multiple clamp assist circuits 400 arranged in parallel, thereby achieving additional benefits. In some examples, such as the example of FIG. 5B, the parallel clamp assist circuits 400B are constant clamp assist circuits.

Figure 6:
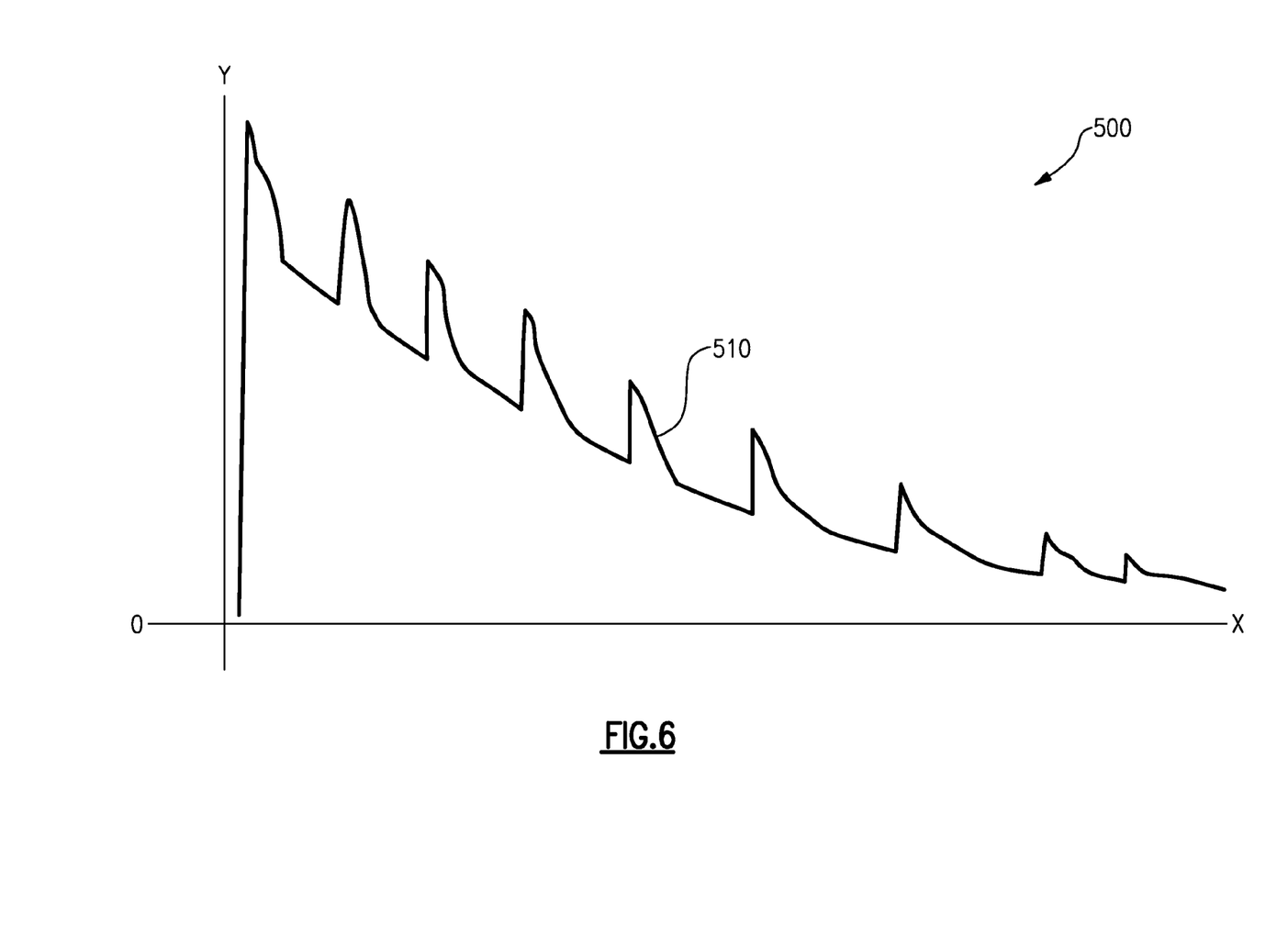
FIG. 6 illustrates a plot of energy dissipation within the circuit of FIG. 5 during a high energy event.

FIG. 6 illustrates a plot 500 of the energy dissipation in a low side driver pulsed clamp assist circuit such as the pulsed clamp assist circuit 400 of FIG. 5. Line 510 indicates the amount of energy dissipated with respect to time by the pulsed clamp assist circuit. Each time the clamp assist circuit 400 pulses, a corresponding energy pulse occurs in the clamp assist circuit. The energy then dissipates and another pulse occurs. As can be appreciated, the pulsing significantly increases the magnitude of energy absorbed by the clamp assist circuit, thereby decreasing the amount of energy required to be absorbed by the internal clamp of the driver switch.

In a further example, any of the previously described clamp assist circuits 10, 100, 300, 400 can be utilized in conjunction with any other of the previously described clamp assist circuits 10, 100, 300, 400 in the parallel clamp assist configuration and provide further benefits.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:
1. A transistor driven load circuit comprising:
  a gate driver transistor including an internal voltage clamp;
  a controller providing a gate control signal operable to control a state of said gate driver;

a load connected to said gate driver, such that said gate driver allows power to flow through said load when said gate driver is in an on state and prevents power from flowing through said load when said gate driver is in an off state;

a clamp assist circuit connected in electrical parallel to said load, wherein said clamp assist circuit is operable to dissipate energy flowing through said load during a high energy event in a recirculating device; and wherein the clamp assist circuit is a pulsed clamp assist circuit comprising a voltage divider operable to set an on threshold for a recirculating device and an oscillator circuit operable to pulse said recirculating device when said on threshold is exceeded.

2. The transistor driven load circuit of claim 1, wherein said gate driver transistor connects said load to ground.

3. The transistor driven load circuit of claim 1, further comprising at least one parallel clamp assist circuit connected to said load and connected in electrical parallel to said clamp assist circuit.

4. The transistor driven load circuit of claim 3, wherein each of said parallel clamp assist circuits comprises a voltage divider operable to set a voltage threshold at which the parallel clamp assist circuit activates, and wherein the voltage threshold of each of the parallel clamp assist circuits is not identical in all of the parallel clamp assist circuits.

5. The transistor driven load circuit of claim 1, wherein said clamp assist circuit comprises a voltage divider circuit operable to set a voltage threshold at which said clamp assist circuit activates.

6. The transistor driven load circuit of claim 1, wherein the recirculating device is at least one transistor.

7. The transistor driven load circuit of claim 1, wherein the oscillator circuit comprises at least a Schmidtt trigger.

8. The transistor driven load circuit of claim 1, further comprising a parallel clamp assist circuit connected in electrical parallel with said pulsed clamp assist circuit and wherein said parallel clamp assist circuit is a constant clamp assist circuit.

* * * * *